MULTIPLE BAND-PASS AMPLIFIER
Filed Jan. 5, 1953 2 Sheets-Sheet 1
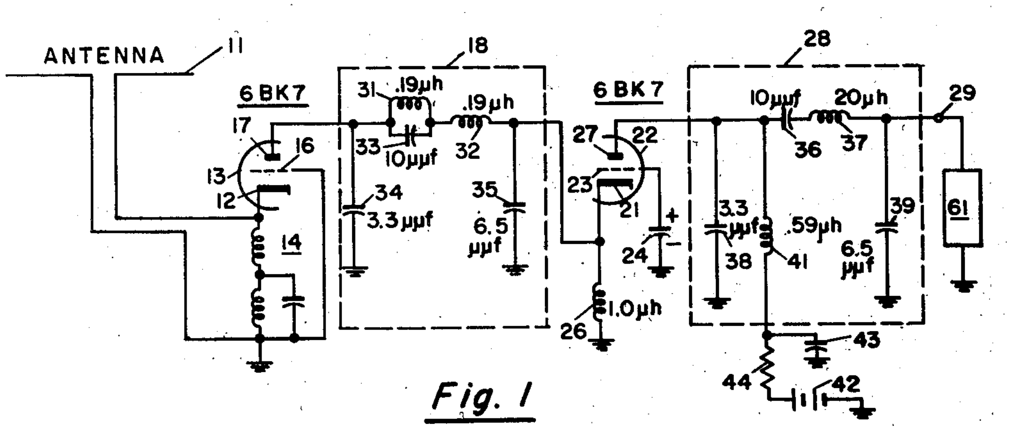
Fig. 1
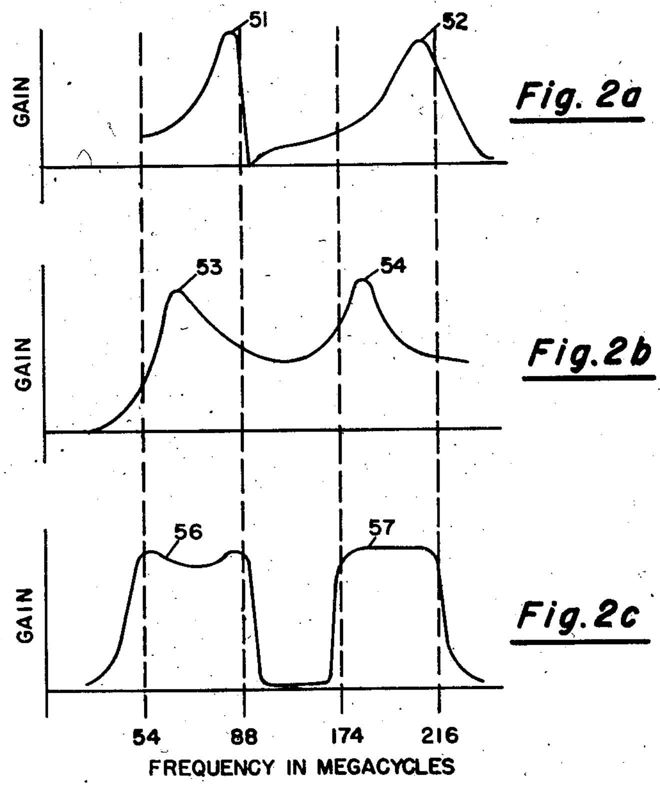
Fig. 2a
Fig. 2b
Fig. 2c
Fig. 2
INVENTORS
ALBERT E. HYLAS
BY WALTER V. TYMINSKI
Darby + Darby
ATTORNEYS April 23, 1957 A. E. HYLAS ET AL 2,790,035
MULTIPLE BAND-PASS AMPLIFIER
Filed Jan. 5, 1953 2 Sheets-Sheet 2
Fig. 3a, Fig. 3b
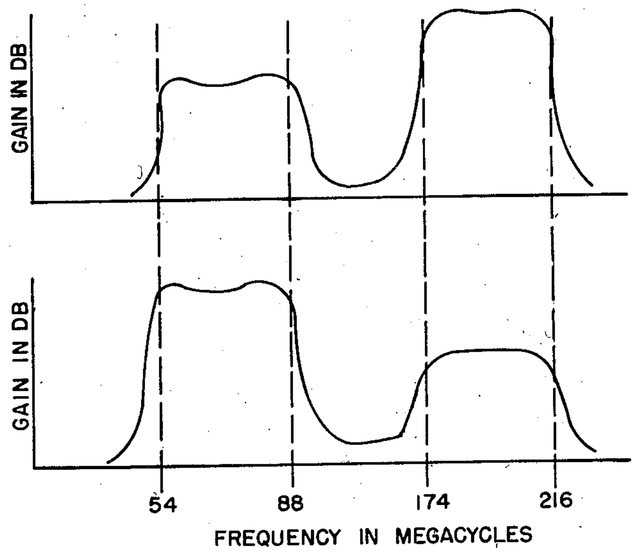
Fig. 3
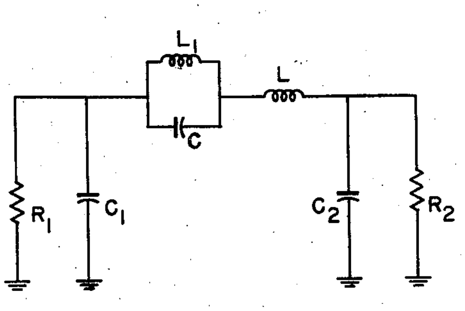
Fig. 4
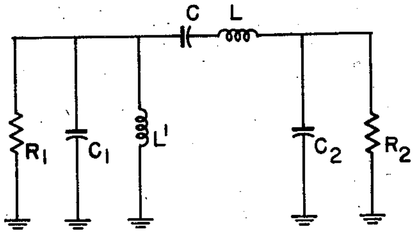
Fig. 5
INVENTORS
ALBERT E. HYLAS
WALTER V. TYMINSKI
BY Darby & Darby
ATTORNEYS

United States Patent Office 2,790,035

Patented Apr. 23, 1957

2,790,035

MULTIPLE BAND-PASS AMPLIFIER

Albert E. Hylas, Clifton, and Walter V. Tyminski, Nutley, N. J., assignors to Allen B. Du Mont Laboratories, Inc., Clifton, N. J., a corporation of Delaware Application January 5, 1953, Serial No. 329,554

1 Claim. (Cl. 179—171)

This invention relates to electrical amplifiers having multiple band-pass characteristics wherein two or more bands of frequencies are amplified, and remaining frequencies are not amplified or are attenuated.

In the past, it has been difficult to achieve suitable multiple band-pass characteristics in a single unbalanced amplifier, or in balanced amplifiers without the use of feedback. It has been particularly difficult to design a multiple band-pass amplifier suitable for amplifying the widely separated channels in the U. H. F. television frequency spectrum. It also has been difficult to achieve proper relative amplitudes of amplification in the two bands of frequencies. Accordingly, resort has frequently been made to the employment of two amplifiers in parallel, one for the high-band signals and the other for the low-band signals, and combining the signal outputs thereof by means of crossover networks. By adjusting the relative gains of the two amplifiers, it has been possible to achieve equal or other desired ratios of amplitudes of the amplification of the high-band and low-band television signals.

An object of the present invention is to accomplish in a single amplifier the above-mentioned characteristics, which heretofore have been best accomplished by the use of two amplifiers in combination which input and output crossover networks.

Another object is to provide a multiple band-pass amplifier having wide frequency separation between pass-bands and which is particularly suitable for amplifying television signals.

A further object is to provide a double band-pass amplifier in which the power gain in the two pass-bands may be adjusted or shifted from one pass-band to another.

Other objects will be apparent.

Referring to the drawing,

Fig. 1 shows a schematic electrical diagram of a preferred embodiment of the invention, Fig. 2 shows frequency-response curves of the electrical networks employed in the amplifier of Fig. 1, Fig. 3 shows modifications of the frequency characteristics which may be accomplished in the amplifier of Fig. 1, and Figs. 4 and 5 are schematic representations of electrical networks, in accordance with the invention, for the purpose of mathematical analysis.

The preferred embodiment of the invention, shown in Fig. 1, comprises an antenna 11 connected to the input electrode 12, which in this case is the cathode, of a first amplifier tube 13. A multiple resonant circuit 14 is connected between the cathode 12 and electrical ground. The control grid 16 is grounded. The output electrode 17 is connected to the input of a coupling network 18 which will be described in detail hereafter. The output of the network 18 is connected to a cathode 21 of a second amplifier tube 22, the control electrade 23 thereof being connected to a source 24 of positive polarity potential. An electrical impedance 26 is connected between the cathode 21 and electrical ground. An output electrode 27 of the tube 22 is connected to the input of a second coupling network 28 which will be described in detail hereafter. An output terminal 29 of the network 28 serves as the output signal terminal of the amplifier.

Now referring particularly to the coupling network 18, this network comprises electrical inductances 31 and 32 connected in series between the input and output terminals thereof. A condenser 33 is connected in parallel with the inductance 31. Condensers 34 and 35 are respectively connected between the input and output terminals of the network and electrical ground, the electrical ground serving as additional input and output terminals in common.

The coupling network 28 comprises a condenser 36 and an inductance 37 connected in series between the input and output terminals thereof, condensers 38 and 39 connected respectively between the input and output terminals and electrical ground, the electrical ground providing additional input and output terminals in common, and an inductance 41 connected between the input terminal of the filter 28 and a source 42 of positive polarity potential through a filter comprising a bypass condenser 43 and filter resistor 44. The condenser 43 serves to connect the bottom end of the inductance 41 to electrical ground and to the bottom end of the condenser 38, so that the inductance 41 and condenser 38 are effectively connected in electrical parallel.

The networks 18 and 28 each have the characteristic of providing double band-pass characteristics which, when added together, provide an overall band-pass characteristic which is suitable for use in the V. H. F. and U. H. F. television spectrums. For convenience the application of these principles to the practical case of a V. H. F. amplifier will be used for the purposes of explanation. Fig. 2*a* shows the band-pass characteristic, with respect to frequency, of the network 18. Fig. 2*b* shows the band-pass characteristic, with respect to frequency, of the network 28. Fig. 2*c* shows the overall band-pass characteristic of the amplifier shown schematically in Fig. 1. In Fig. 2, the low-frequency television band is indicated as extending from 54 to 88 megacycles, and the high-frequency television band is shown as extending from 174 to 216 megacycles, these being the frequency standards now in use in the United States in the V. H. F. television spectrum.

The frequency response of the coupling network 18, as shown in Fig. 2*a*, comprises an asymmetrical peak 51 in the low-frequency television band and near the upper limit thereof, and contains a symmetrical peak 52 in the high-frequency television band near the upper limit thereof.

The coupling network 28 provides a frequency response, as shown in Fig. 2*b*, having an asymmetrical peak 53 in the low-frequency band near the low end thereof, and a symmetrical peak 54 in the high-frequency band near the lower limit thereof. The asymmetrical peaks 51 and 53 of the filters 18 and 28 are complementary and produce an overall low-frequency band-pass characteristic 56, as shown in Fig. 2*c*, whereas the peaks 52, 54 in the high-frequency band are stagger-tuned and combine to produce the overall response curve 57 in the high-frequency band.

It will be appreciated that the overall curves 56, 57, shown in Fig. 2*c*, are an almost ideal response curve for an amplifier of the VHF television frequencies. This response is produced by a novel combination of unique transfer networks, whereby asymmetrical responses in the low-frequency band, and symmetrical responses in the high-frequency band, are utilized in combination to produce the desired overall characteristics shown in Fig. 2*c*. Thus the necessity of employing two separate amplifiers, one for amplifying the high-band signals and the other for amplifying the low-band signals, has been eliminated.

The coupling network 18 functions as follows: In the low-frequency band, the condenser 33 has relatively high impedance, whereby the inductances 31 and 32 are effectively combined to form a single inductance, which forms a well known pi-tuned circuit in conjunction with the the shunt condensers 34 and 35, this circuit being tuned to produce the low-band curve 51 shown in Fig. 32*a*. At frequencies in the high-band, the condenser 33 has a very low impedance and effectively shunts out or short circuits the inductance 31 whereupon the inductance 32 forms a pi-tuned circuit in conjunction with the condensers 34 and 35, which produces the response curve 52 shown in Fig. 2*a*.

The coupling network 28 functions as follows: In the low-frequency band, the condenser 36 has a relatively high impedance with respect to the inductance 37 thereby rendering the effect of the inductance 37 relatively insignificant. That is, the combination of the condenser 36 and inductance 37, is capacitive. Thus the circuit comprises essentially the inductance 41 connected in parallel with the condenser 38; a slight amount of additional shunt capacitance is provided by the combination of the condensers 36 and 39 connected in electrical series. The parallel resonance of these elements produces the curve 53 shown in Fig. 2*b*. In the high-frequency band, the inductance 41 has a relatively high impedance and is thereby relatively ineffective in the circuit, whereas the condenser 36 has a relatively low impedance and is virtually a short circuit at these higher frequencies. That is, the combination of the condenser 36 and inductance 37 is inductive. Accordingly, at the higher frequencies the network 28 acts as a pi-tuned circuit with the inductance 37 being the series element thereof, and the condensers 38 and 39 being the shunt elements thereof.

The values of the components given in Fig. 1 will cause the circuit to have a double band-pass characteristic, each band-pass thereof having approximately the same amplitude, as is indicated in Fig. 2*c*. In certain applications, however, it is desirable to shift the relative power gains of the response in the two pass-bands, without changing the frequencies at which the band-pass responses occur. For example, it is sometimes desired to provide a relatively higher gain in the higher frequency band than in the lower frequency band, as shown in Fig. 3*a*, in order to compensate for inherent poor high-frequency response in equipment with which the amplifier is to be used. The novel amplifier circuit is particularly suitable for use when such an adjustment is desired to be made. The high-frequency gain may be increased, at the expense of the low-frequency gain, to produce the characteristic shown in Fig. 3*a*, as follows: In the network 18, the value of the capacitance 33 is increased, and the inductance 31 is decreased in value so as to maintain the same parallel resonance frequency with the condenser 33, and the inductance 32 is decreased in value to maintain the same series resonance with the condenser 33. Correspondingly, in the network 28, the high-frequency response in increased by increasing the capacitance of the condenser 36, and the inductance 41 is decreased in value to maintain the same parallel-resonance frequency with the condenser 36 (the right-hand end of the condenser 36 is effective electrically connected to the lower end of the inductance 41, through the relatively low impedance of the inductance 37 and the relatively low impedance of the external circuit 61 connected to the output terminal 29), and the inductance 37 is decreased in value to maintain the same series-resonance frequency with respect to the condenser 36.

By making the changes outlined above, the high-band gain is increased and the low-band gain is decreased without shifting the boundary frequencies of the pass-bands. If desired, the low-band gain may be made relatively greater than the high-band gain as illustrated in Fig. 3*b*, by decreasing the values of the condensers 33 and 36, and correspondingly altering the values of the inductances in the coupling networks 18 and 28 in opposite directions from that outlined above so as to maintain the same parallel and series resonance frequencies.

The electrical characteristics of the network 18 may be computed from the following equation (refer to Fig. 4):

$$\frac{Z_T}{R_{11}}=\frac{1}{\left[1-\frac{(1+SK)tqx^2f(x)}{1+K}\right]+J\left[\frac{q(1+S)x}{1+K}-\frac{(K-Sq^2x^2)txf(x)}{1+K}\right]}$$

in which $\frac{Z_T}{R_{11}}$=normalized transfer impedance $R_{11}$=impedance of $R_1$ and $R_2$ in parallel $$K=\frac{R_2}{R_1}$$

$$x=\frac{W}{W_1}$$

$$W_1^2=\frac{L}{C_1Lo}\text{ where }Lo=1\text{ microhenry}$$

$$W_2=\frac{R_2}{L}$$

$$W_3=\frac{1}{C_1R_2}$$

$$t=\frac{W_1}{W_2}$$

$$q=\frac{W_1}{W_3}$$

$$f(x)=\frac{(x^2-xo^2)}{(x^2-x_p^2)}$$

$$x_p^2=\frac{C_1Lo}{CL^1}$$

$$xo^2=\frac{LoC_1}{L^1C}\left[1-\frac{1}{LC}\right]$$

and $$S=\frac{C_2}{C_1}$$

The electrical characteristics of the network 28 may be computed from the following equation (refer to Fig. 5):

$$\frac{Z_T}{R_{11}}=\frac{1}{\left[1-\frac{\left[StqK+qt\left(1-\frac{r^2}{x^2}\right)\right]x^2\left(1-\frac{g^2}{x^2}\right)}{1+K}\right]+J\left[qx\frac{\left[S+\left(1-\frac{r^2}{x^2}\right)\right]}{1+K}+\frac{\left[Kt-Stq^2x^2\left(1-\frac{r^2}{x^2}\right)\right]x\left(1-\frac{q^2}{x^2}\right)}{1+K}\right]}$$

in which $\frac{Z_T}{R_{11}}$=normalized transfer impedance $R_{11}$=impedance of $R_1$ and $R_2$ in parallel $$K=\frac{R_2}{R_1}$$

$$X=\frac{W}{W_1}$$

$$W_1^2=\frac{1}{C_1Lo} \text{ where } Lo=1 \text{ microhenry}$$

$$W_2=\frac{R_2}{L}$$

$$W_3=\frac{1}{C_1R_2}$$

$$W_4^2=\frac{1}{L^1C_1}$$

$$W_5^2=\frac{1}{LC}$$

$$t=\frac{W_1}{W_2}$$

$$q=\frac{W_1}{W_3},\ S=\frac{C_2}{C_1}$$

$$r=\frac{W_4}{W_1}$$

and $$g=\frac{W_5}{W_1}$$

Initial adjustment of the novel coupling circuits is most readily accomplished by first adjusting the values of the inductances 32 and 37 in order to align the high-frequency band response, and then adjusting the inductances 31 and 41 in order to align the low-frequency band response. This alignment can be made satisfactorily if the condensers in the filter have approximately the correct values. The shunt capacitances 34, 35, 38, 39 may comprise, in whole or in part, electrode capacitances of electronic tubes and wiring capacitance.

In addition to providing a new and improved frequency response characteristic in which a plurality of band-pass responses may have their amplitudes adjusted, the novel combination of coupling networks provides proper impedance coupling from the relatively high-output impedance of the amplifier tubes, to the relatively low-input impedance of the cathodes thereof. A further advantage is obtained by the fact that the network 18 provides a direct-current path between the input and output terminals thereof, so that a single source 42 of voltage may be employed to operate both of the amplifier tubes 13 and 22, these tubes being connected in series with respect to the voltage source 42. The network 28 provides D. C. blocking between the source of voltage 42 and the amplifier output, without the use of additional components.

While a preferred embodiment of the invention has been shown and described, various modifications thereof will be apparent to those skilled in the art. The scope of the invention is defined in the following claim.

What is claimed is:

A single ended multiple band-pass amplifier for amplifying frequencies in two frequency-separated pass bands comprising first and second amplifying stages, said first stage comprising an electron discharge device having at least a cathode, a control grid and an anode, first and second inductance elements connected in series between said cathode and ground, a first condenser having one end connected to ground and its other end connected to the junction between said first and second inductance elements, said grid connected to ground and a first double band-pass network having pairs of input and output terminals, two inductance elements connected in series between one input terminal and one output terminal, the other said input and output terminals connected to ground, a condenser connected in parallel with one of said inductance elements, said anode connected to said one input terminal, and capacitances connected respectively between said pairs of input and output terminals, said second stage comprising a second electron discharge device having a cathode, a control grid and an anode, an inductance element connected in series between said second discharge device cathode and ground, said one output terminal of said first network connected to said last mentioned cathode, a first source of positive polarity potential connected between said control grid and ground and a second double band-pass electrical network having pairs of input and output terminals, one of said second network input terminals connected to said second discharge device anode, the other second network input terminal connected to ground, an inductance element and a capacitance connected between said one second network input terminal and one second network output terminal, the other said second network output terminal connected to ground, a capacitance connected between said second network input terminals and a capacitance connected between said second network output terminals, an inductance element having one end connected to said second discharge device anode, a second source of positive polarity potential connected between the remaining end of said last mentioned inductance element and ground, a source of signals applied between the cathode of said first stage and ground, and a utilization circuit connected between said second network, one output terminal and ground.

References Cited in the file of this patent

UNITED STATES PATENTS

| | | |
|---|---|---|
| 1,438,828 | Houck | Dec. 12, 1922 |
| 1,557,860 | Mathes | Oct. 20, 1925 |
| 1,568,142 | Elsasser | Jan. 5, 1926 |
| 1,708,950 | Norton | Apr. 26, 1929 |
| 1,938,620 | Braden | Dec. 12, 1933 |
| 2,370,399 | Goodale | Feb. 27, 1945 |
| 2,422,087 | Everett | June 10, 1947 |
| 2,429,652 | Terman | Oct. 28, 1947 |
| 2,544,508 | Mackey | Mar. 6, 1951 |
| 2,710,314 | Tongue et al. | June 7, 1955 |

OTHER REFERENCES

Text, "Vacuum Tube Amplifiers," pages 166–231, Valley & Wallman, published 1948 by McGraw-Hill Book Company, N. Y. C.